United States Patent [19]
Nix et al.

[11] Patent Number: 5,573,809
[45] Date of Patent: Nov. 12, 1996

[54] PROCESS FOR FORMING A MAGNETORESISTIVE DEVICE

[75] Inventors: J. Lamar Nix; Guy F. Ruse, both of Boulder, Colo.

[73] Assignee: Quantum Peripherals Colorado, Inc., Boulder, Colo.

[21] Appl. No.: 461,873

[22] Filed: Jun. 5, 1995

[51] Int. Cl.$^6$ .................................................. B05D 5/12
[52] U.S. Cl. ................ 427/123; 156/643.1; 427/126.2; 427/126.4; 427/131; 427/132; 427/259; 427/266; 427/270; 427/272; 427/282; 427/287; 427/331; 427/404; 427/419.2
[58] Field of Search .................................. 427/131, 132, 427/123, 126.2, 126.4, 259, 266, 270, 272, 282, 287, 331, 404, 419.2; 156/643.1

[56] References Cited

U.S. PATENT DOCUMENTS

| | | | |
|---|---|---|---|
| 3,840,898 | 10/1974 | Bajorek et al. | 360/113 |
| 4,639,806 | 1/1987 | Kira et al. | 360/113 |
| 4,663,685 | 5/1987 | Tsang | 360/113 |
| 4,713,708 | 12/1987 | Krounbi et al. | 360/113 |
| 4,809,109 | 2/1989 | Howard et al. | 360/113 |
| 4,825,325 | 4/1989 | Howard | 360/113 |
| 4,841,398 | 6/1989 | Mowry | 360/113 |
| 5,005,096 | 4/1991 | Krounbi et al. | 360/113 |
| 5,206,590 | 4/1993 | Dieny et al. | 324/252 |

FOREIGN PATENT DOCUMENTS

| | | |
|---|---|---|
| 0375646A2 | 6/1990 | European Pat. Off. . |
| 0422806A2 | 4/1991 | European Pat. Off. . |

Primary Examiner—Bernard Pianalto
Attorney, Agent, or Firm—William J. Kubida; David B. Harrison

[57] ABSTRACT

A soft adjacent layer biased magnetoresistive ("MR") device, and a method for producing the same, which incorporates a natural flux closure design utilizing coplanar thin film permanent magnets to stabilize the device while obviating induced domain walls in the magnetoresistive and soft adjacent layers ("SAL"). The device structure includes an SAL film and overlying magnetic spacer layer ("MSL") in conjunction with an MR film to produce an SAL biased magnetoresistive structure ("MRS") with the MR layer patterned to a shortened length with respect to the SAL and MSL layers. A non-magnetic metal or dielectric separation layer of on the order of 20–300 angstroms ("Å") is then deposited over the MSL layer and the sides of the MR layer followed by the deposition of permanent magnet layer portions substantially coplanar with the MR layer to produce a low energy equilibria device with high sensitivity and superior signal output.

22 Claims, 5 Drawing Sheets

PROCESS FOR FORMING A MAGNETORESISTIVE DEVICE

CROSS REFERENCE TO RELATED APPLICATIONS

The present invention is related to the subject matter of U.S. patent application Ser. No. 08/392,393 filed Feb. 22, 1995 for "Magnetoresistive Device and Method Having Improved Barkhausen Noise Suppression", now U.S. Pat. No. 5,485,334, issued Jan. 16, 1996 which application is a continuation of U.S. patent application Ser. No. 07/975,479 filed Nov. 12, 1992, now abandoned. The present invention is also related to the subject matter of U.S. patent application Ser. No. 08/461,874 filed on even date herewith for "Soft Adjacent Layer Biased Magnetoresistive Device Incorporating a Natural Flux Closure Design Utilizing Coplanar Permanent Magnet Thin Film Stabilization", U.S. Pat. No. 5,532,892 and Ser. No. 08/392,149 filed Feb. 22, 1995, which earlier filed application is a divisional application of U.S. patent application Ser. No. 07/975,479 filed Nov. 12, 1992, now abandoned. The foregoing patent applications are assigned to Rocky Mountain Magnetics, Inc., Louisville, Colo., assignee of the present invention, and the disclosures thereof are herein specifically incorporated by this reference.

BACKGROUND OF THE INVENTION

The present invention relates, in general, to the field of magnetoresistive ("MR") devices and methods for fabricating the same. More particularly, the present invention relates to a soft adjacent layer biased magnetoresistive sensor and method for fabricating the same incorporating a natural flux closure design utilizing a substantially coplanar permanent magnet thin film stabilization to obviate induced domain walls in the magnetoresistive and soft adjacent layers.

Magnetoresistive sensors, or heads, are known to be useful in reading data from a magnetic media with a sensitivity exceeding that of inductive or thin film heads. In operation, an MR sensor is used to detect magnetic field signal changes from a magnetic media due to the fact that the resistance of the MR sensor changes as a function of the direction and amount of magnetic flux being sensed.

It is also generally known that for an MR sensor to function effectively, it must be subjected to a transverse bias field to linearize its response. The transverse bias field is applied normal to the plane of the magnetic media and parallel to the surface of the MR sensor. Various techniques for effectuating such transverse biasing are presently known including current shunt and soft adjacent layer ("SAL") film biasing, with the latter technique being generally superior for extending the usefulness of MR sensors to storage devices of ever higher areal densities.

It is also known that an MR sensor may be utilized in conjunction with a longitudinal bias field extending parallel to the surface of the magnetic media and parallel to the major axis of the MR sensor. Stabilization of MR sensors by means of a longitudinal bias field is necessary for their application with high track density disk files in order to suppress Barkhausen noise. Barkhausen noise results from unstable magnetic properties such as multi-domain activities within the MR element.

With respect to the application of a longitudinal bias field for the suppression of Barkhausen noise in an MR sensor, the literature describes a number of techniques primarily dealing with "exchange bias" through use of an antiferromagnet coupled in some manner to the MR device. With these exchange bias MR sensors, the materials in general use to form an antiferromagnet, such as manganese and its alloys, are known to be highly reactive and have poor thermal characteristics.

In an attempt to solve the problems inherent with the use of an antiferromagnet to provide longitudinal bias, a number of references currently describe the use of an MR sensor stabilized through the use of permanent magnet films. In general, conventional MR head designs using permanent magnets for Barkhausen noise suppression have been found to be not particularly well suited for use with closely coupled magnetic shielding layers. Moreover, while the use of permanent magnet films to provide longitudinal bias is perhaps the most efficacious technique known, conventional designs nevertheless result in inferior and/or unreliable performance due to the tendency of the flux from the interior ends of the permanent magnet films to nucleate undesired edge domains in both the MR and soft adjacent layer films.

The ultimate effectiveness of a given MR device is very much dependant upon the properties of the design employed, particularly when it is used in conjunction with magnetic shields. In this regard, an especially effective design is disclosed in the aforementioned U.S. patent application Ser. No. 07/975,479 filed Nov. 12, 1992. However, the configuration described may, in some instances, result in the device having an equilibrium with a relatively high energy state and, at numerous realizable states of the device, there exist multiple energy equilibrium states. As a consequence, despite the robustness of the design, the possibility exists that the MR or SAL layers might switch irretrievably into one of the nearby states thus altering the device transfer characteristics and, hence, its operating characteristics. The consequence of such a change could render the device inoperative as an effective data transducer in a particular computer mass storage application.

SUMMARY OF THE INVENTION

Disclosed herein is a design for a soft adjacent layer biased magnetoresistive device, and a method for producing the same, which incorporates a natural flux closure design utilizing substantially coplanar thin film permanent magnets to stabilize the device while obviating induced domain walls in the magnetoresistive and soft adjacent layers. The device disclosed comprises an SAL film and overlying magnetic spacer layer ("MSL") in conjunction with an MR film to produce an SAL biased magnetoresistive structure ("MRS") with the MR layer patterned to a shortened length with respect to the SAL and MSL layers. A separation layer, which may comprise a non-magnetic metal such as chromium ("Cr"), a weak antiferromagnet or a dielectric material such as alumina ("$Al_2O_3$"), is then deposited over the MSL layer and the sides of the MR layer to a thickness of on the order of 20–300 angstroms ("Å"). Permanent magnet layer portions are then deposited over the separation layer followed by low resistivity metal conductor electrodes, with the spacing between the electrodes defining the sensor active track width.

The electrodes may, in a preferred embodiment, be coextensive with the medial ends of the permanent magnet layer portions. Alternatively, they may overly and contact the MR layer or be located at a point intermediate the permanent magnet layer portions and the MR layer.

With the design herein disclosed, in its unexcited state, the magnetic spins in the MR and SAL layers will naturally lie in an antiparallel state. Similarly, with an applied bias current and external field applied, this natural antiparallelism will result in lower energy equilibria and, because there are fewer equilibrium states open to the MR and SAL layers, more dependable device operation is realized. Still further, due to its natural flux closure design, this lower energy configuration results in higher device sensitivity and greater signal output than is produced by existing sensors.

Broadly, what is disclosed herein is a magnetoresistive device comprising a magnetoresistive layer presenting first and second oppositely disposed end portions transverse to a major axis thereof. The magnetoresistive layer is disposed in an overlying relationship with respect to a soft adjacent layer. First and second permanent magnet layer portions are positioned in an overlying relationship with respect to the soft adjacent layer and disposed adjacent to, but spaced apart from, the first and second end portions of the magnetoresistive layer in a generally coplanar relationship thereto.

Further disclosed is a magnetoresistive device comprising a magnetoresistive layer having a soft adjacent layer in an underlying relationship with respect thereto. A separation layer adjoins opposing end portions of the magnetoresistive layer and first and second permanent magnet regions are contiguous with the separation layer and generally coplanar with the magnetoresistive layer at the end portions thereof. In operative association, the first and second permanent magnet regions provide a longitudinal bias to the magnetoresistive layer.

In accordance with a method for producing a magnetoresistive device as described above there is disclosed a process for forming a magnetoresistive device which comprises the steps of providing a substrate, forming a soft adjacent layer on the substrate and then forming a magnetic spacer layer on the soft adjacent layer. A magnetoresistive layer is then formed on the magnetic spacer layer and a photoresist region is then patterned on the magnetoresistive layer. Portions of the magnetoresistive layer surrounding the photoresist region are removed to define a magnetoresistive mesa. The process further comprises the steps of forming first and second separation layer portions on the magnetic spacer layer and adjoining side portions of the magnetoresistive mesa, next forming first and second permanent magnet layer portions on the first and second separation layer portions respectively and then forming first and second conductive layer portions adjoining the first and second permanent magnet layer portions respectively. The photoresist region is then removed from the magnetoresistive layer. In accordance with a more specific process, another photoresist region may be additionally patterned on the first and second conductive layer portions and an upper surface of the magnetoresistive mesa whereupon portions of the first and second conductive layer portions and the upper surface of the magnetoresistive mesa surrounding the photoresist region are removed to define the physical dimensions of the magnetoresistive device.

BRIEF DESCRIPTION OF THE DRAWINGS

The foregoing, and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
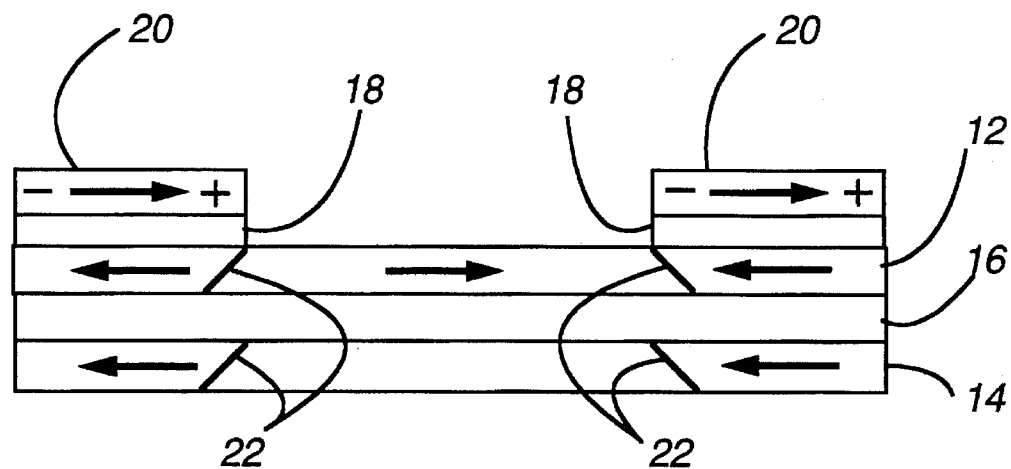
FIG. 1 is a simplified cross sectional air bearing surface ("ABS") plan view of a prior art magnetoresistive sensor utilizing permanent magnet thin film layers to provide a longitudinal bias to an underlying MR layer and indicating the undesirable stacked nature of the device and induced domain walls formed within the MR and SAL layers in response thereto.

With reference now to FIG. 1, a prior art MR sensor 10 is shown. The prior art MR sensor 10 comprises, in pertinent part, an MR layer 12 in an overlying relationship with respect to a SAL layer 14, the two layers being separated by an MSL layer 16. A pair of conductors 18 are formed on an upper surface of the MR layer 12 to provide electrical contact thereto. In like manner, a pair of permanent magnet layers 20 are also stacked over the conductors 18 to provide longitudinal bias to the MR layer 12.

In addition to the undesirable stacked nature of the prior art MR sensor 10, wherein the permanent magnet layers 20 are in an overlying relationship with respect to an MR layer 12, which is itself generally coextensive in length with the underlying SAL layer 14 and MSL layer 16, this device design exhibits the tendency to nucleate edge domains in both the MR layer 12 and SAL layer 14. This is primarily due to the magnetic flux emanating from the medial ends of the permanent magnet layers 20 producing the induced domain walls 22 in the area shown. As can be seen, the induced domain walls 22 cause a reversal of the flux in the active region of the MR layer 12 and also result in an indeterminate magnetic state in the SAL layer 14 in the region underlying the same active region.

Figure 2A:
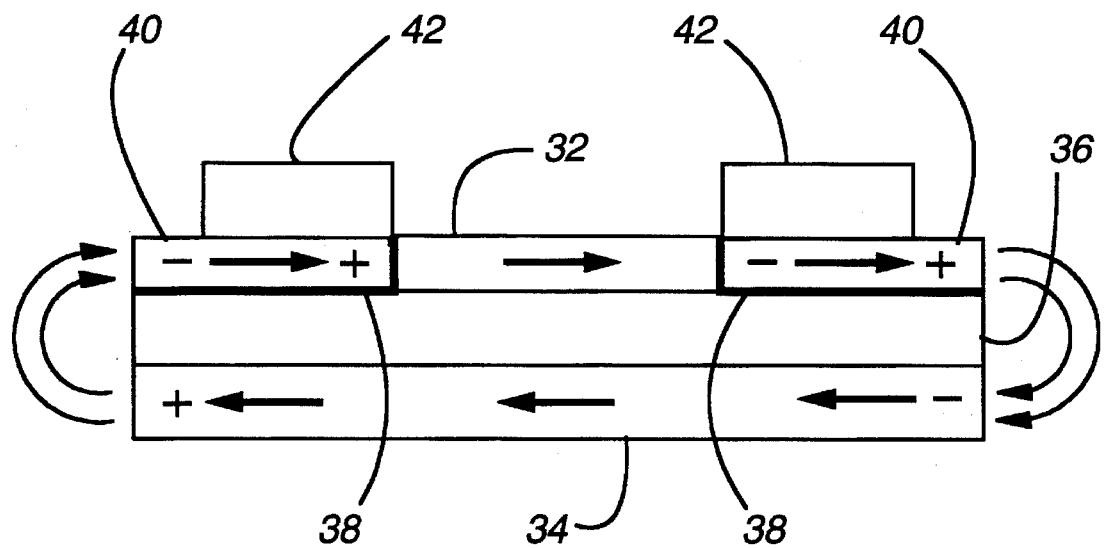
FIG. 2A is a simplified cross sectional ABS plan view of a natural flux closure MR device in accordance with the present invention indicating the substantially coplanar relationship achieved between the permanent magnet layer portions and the active MR layer as well as the absence of induced domain walls utilizing the natural flux closure design herein disclosed.

With reference now to FIG. 2A, a natural flux closure MR device 30 in accordance with the present invention is shown. MR device 30 comprises, in pertinent part, an MR layer 32 which is shortened in length with respect to an underlying SAL layer 34 and an intermediate MSL layer 36. In a particular embodiment, the MR layer 32 may comprise substantially between 200–500 Å of nickel iron ("NiFe").

The SAL layer 34 may also comprise substantially between 200–500 Å of nickel iron molybdenum ("NiFeMo"), nickel iron chromium ("NiFeCr") or nickel iron tantalum ("NiFeTa"). The MSL layer 36 may comprise approximately 100–250 Å of tantalum ("Ta") or titanium ("Ti").

A pair of separation layer portions 38 adjoin the opposing end portions of the MR layer 32 and overlie the MSL layer 36 substantially as shown. A pair of permanent magnet layer portions 40 are deposited over the separation layer portions 38 in substantially coplanar relationship with respect to the MR layer 32. The separation layer portions 38 may comprise a non-magnetic metal such as chromium ("Cr"), a weak antiferromagnet or a dielectric material such as alumina ("Al$_2$O$_3$"). It should be noted that the separation layer can also be utilized to enhance or control the material properties of the MR layer 32. In a particular embodiment, the permanent magnet layers may comprise cobalt platinum ("CoPt"), cobalt platinum tantalum ("CoPtTa") or cobalt platinum chromium ("CoPtCr").

A pair of conductors 42 are formed in contact with and overlying the permanent magnet layer portions 40 as shown to define the trackwidth of the MR device 30 as will be more fully described hereinafter. The conductors 42, which may comprise gold ("Au") or other suitable conductive material, may also, as also described hereinafter, overlie solely the MR layer 32 or overlie both the MR layer 32 and the permanent magnet layer portions 40. In an alternative embodiment (not shown) the permanent magnet layer portions 40 may be utilized as electrical contacts to the MR device 30 in lieu of the conductors 42 shown.

As can be seen, the natural flux closure design of the MR device 30 provides a uniform magnetic flux direction to the MR layer 32 in the active region of the MR device 30 as well as a uniform magnetic flux through the SAL layer 34 due to the flux closure between the lateral ends of the permanent magnet layer portions 40 and the lateral ends of the SAL layer 34. Utilizing the natural flux closure design for the MR device 30 disclosed herein, no undesired domain walls are induced within either the MR layer 32 or the underlying SAL layer 34.

Figure 2B:
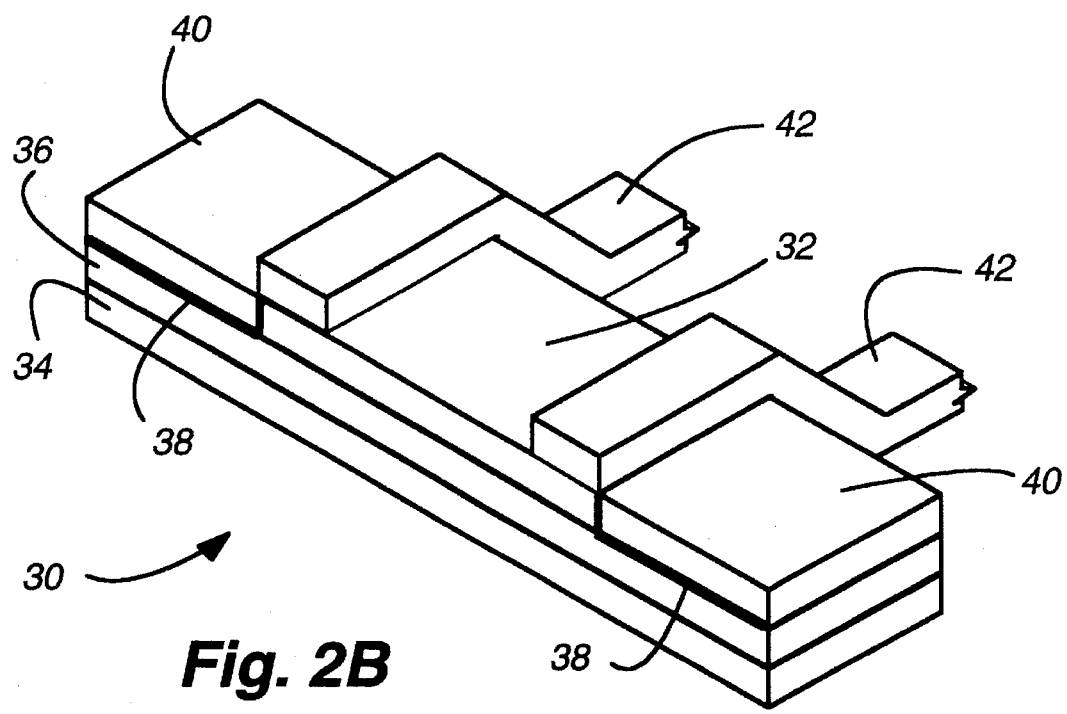
FIGS. 2B and 2C are additional isometric views of the MR device of FIG. 2A wherein, respectively, the conductors are indicated as overlying and contacting the MR layer instead of the permanent magnet layer portions (in a further alternative embodiment, the conductors may be excluded altogether and the permanent magnet layer portions used as the conductors) and the MR layer is patterned into a substantially elliptical shape in lieu of the rectilinear shape illustrated in the preceding FIG. 2A.

With reference now to FIG. 2B, an alternative embodiment for a natural flux closure MR device 30 is shown. As with the preceding embodiment illustrated in FIG. 2A, the MR device 30 comprises a magnetoresistive structure ("MRS") comprising a rectilinear shaped MR layer 32 overlying an SAL layer 34 and having an MSL layer 36 interposed therebetween. The separation layer portions 38 separate the permanent magnet layer portions 40 from the opposing ends of the MR layer 32 as before. In this embodiment, the conductors 42 are aligned with, and provide electrical contact to, the MR layer 32 instead of the permanent magnet layer portions 40 as previously shown and described.

Figure 2C:
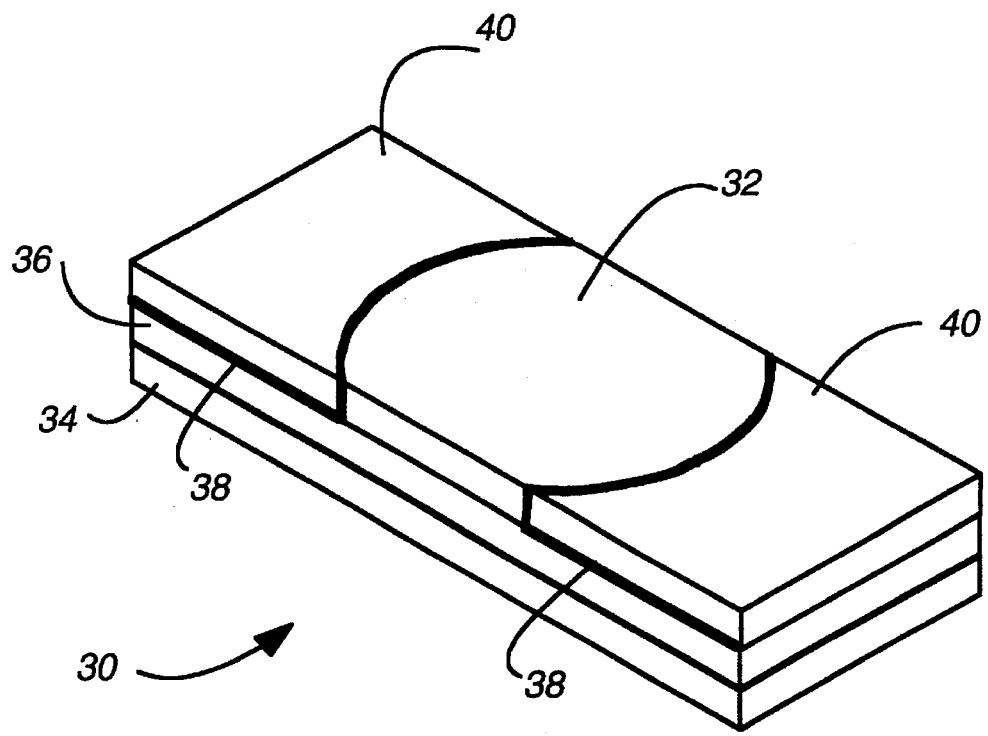

With reference additionally now to FIG. 2C, an additional alternative embodiment of an MR device 30 in accordance with the present invention is shown. In this embodiment, the active portion of the MR device 30 comprises a substantially elliptically shaped MR layer 32 separated from conformally shaped permanent magnet layer portions 40 by means of separation layer portions 38. The substantially ellipsoid shape of the MR layer 32 is disclosed in U.S. patent application Ser. No. 07/975,479 filed Nov. 12, 1992, now abandoned for "Magnetoresistive Device and Method Having Improved Barkhausen Noise Suppression". In a preferred embodiment, the elliptically shaped MR layer 32 will have a principal axis dimension along the longitudinal axis of the MR layer 32 of between 1.1 to 1.5 times the desired magnetic trackwidth. Concomitantly, the axis orthogonal to the longitudinal access of the MR device 30 is preferably between 1.1 to 1.5 times the desired magnetoresistive "stripe height". Following lapping and mechanical polishing of the MR device 30 to form the final, air bearing surface leaves the MR layer 32 with a slightly flattened bottom portion such that all of the MR layer 32 along the ABS is exposed and parallel to the lapped/polished surface.

Figure 3:
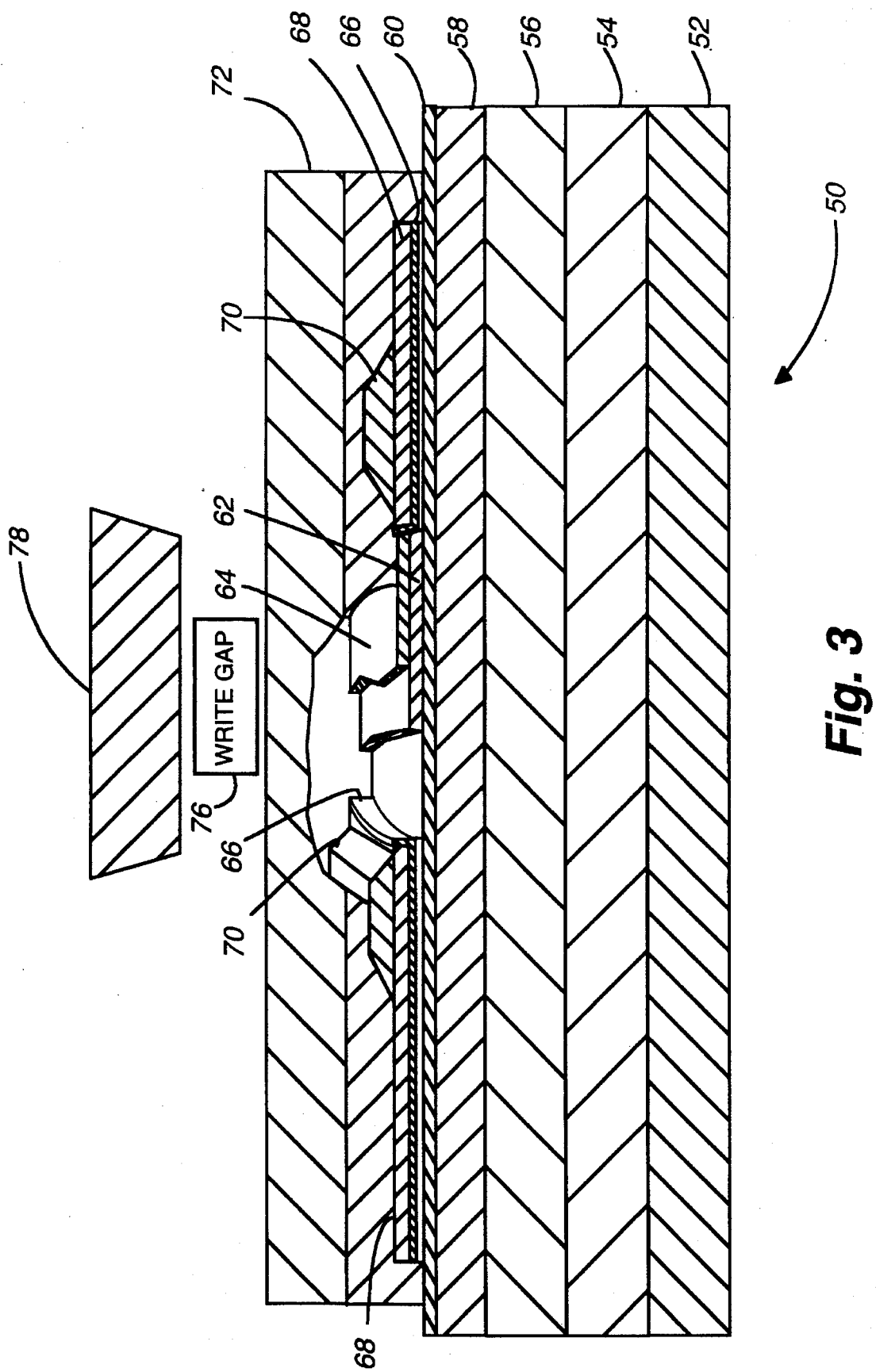
FIG. 3 is a more detailed, partial cross sectional plan and isometric ABS view of a MR read/write transducer in accordance with the present invention incorporating the design of FIGS. 2A–2C further illustrating the transducer substrate and various layers underlying the natural flux closure MR device as well as associated shields and write components.

With reference additionally now to FIG. 3, a natural flux closure MR read/write transducer 50 is shown incorporating the principals of the MR device 30 described previously with respect to FIGS. 2A–2C. The MR read/write transducer 50 is constructed upon a substrate 52 which may comprise silicon ("Si"), glass, alumina titanium carbide ("Al$_2$O$_3$-TiC") or other suitable material.

An overlying underlayer 54 is formed upon the substrate 52 and may comprise silicon dioxide ("SiO$_2$") or alumina. A first shield layer 56 may be formed on top of the underlayer 54 prior to deposition of a first gap layer 58. The first gap layer 58 may comprise either alumina, silicon dioxide or other suitable material.

The MR read/write transducer 50 then presents an SAL layer 60, an overlying MSL layer 62 and a shortened, overlying MR layer 64 forming the device MRS structure. As previously described, separation layer portions 66 are formed over the MSL layer 62 comprising substantially between 20–300 Å of a non-magnetic metal or dielectric material. The separation layer portions 66 adjoin the opposing end portions of the MR layer 64. As also previously described, a pair of permanent magnetic layer portions 68 overlie the two separation layer portions 66 and are separated from the end portions of the MR layer 64 by the thickness of the separation layer portions 66. The permanent magnet layer portions 68 are substantially coplanar with the MR layer 64. A pair of conductors 70 overlie the permanent magnet layer portions 68 in this embodiment and are coextensive with the medial end portions of the permanent magnet layer portions 68. Although shown as somewhat thickened in this particular view, the conductors 70 may be formed using a self-aligned process (as will be discussed hereinafter) wherein they are initially laid down with a relatively small thickness and thereafter increased in thickness by the additional deposition of more conductive material.

The MR read/write transducer 50 comprises a second gap layer 72 which may be formed of materials the same as, or similar to, those of the first gap layer 58. To complete the structure of the MR read/write transducer 50, a merged shield-pole 74, write gap 76 and a trailing write pole 78 are formed.

With reference additionally now to FIGS. 4A–4F, a process flow for constructing a natural flux closure MR device in accordance with the present invention and the preceding description of FIGS. 2A–2C and FIG. 3 is shown.

Figure 4A:
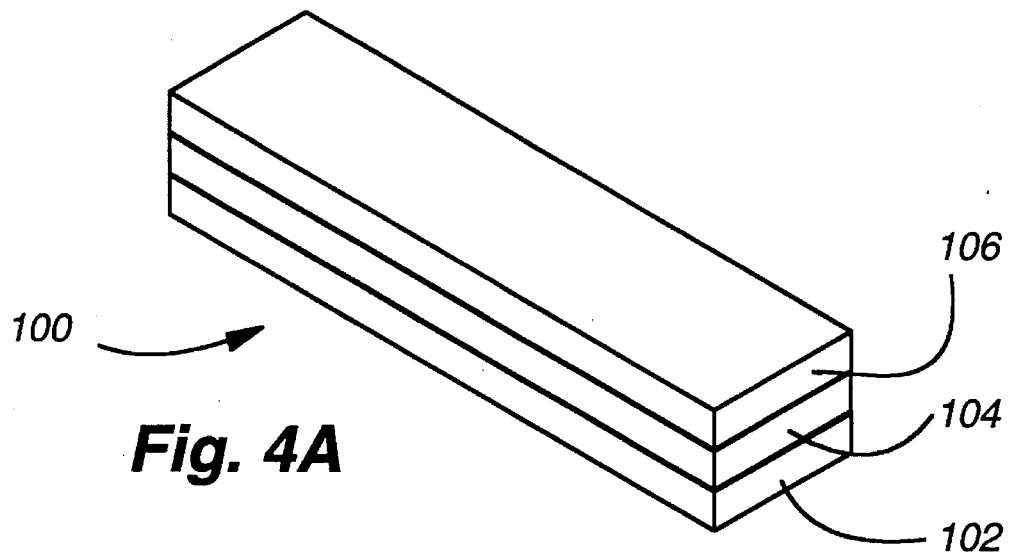
FIGS. 4A, 4B, 4C, 4D and 4E, 4F are successive simplified isometric views of a self-aligned process flow for producing the MR device of the preceding FIGS. 2A, 2B and 2C and 3 illustrating the salient processing steps in the production thereof.

With reference particularly now to FIG. 4A, the MRS layers 100 which may be formed upon the substrate, underlayer, shield and gap layers illustrated in FIG. 3 is shown. The first step shown is the deposition of a soft adjacent layer 102 followed by the deposition of a magnetic spacer layer 104. A blanket MR film deposition forming MR layer 106 then follows. The various materials and thicknesses appropriate for forming the respective portions of the MRS layers 100 may be those described previously with respect to the preceding Figures.

Figure 4B:
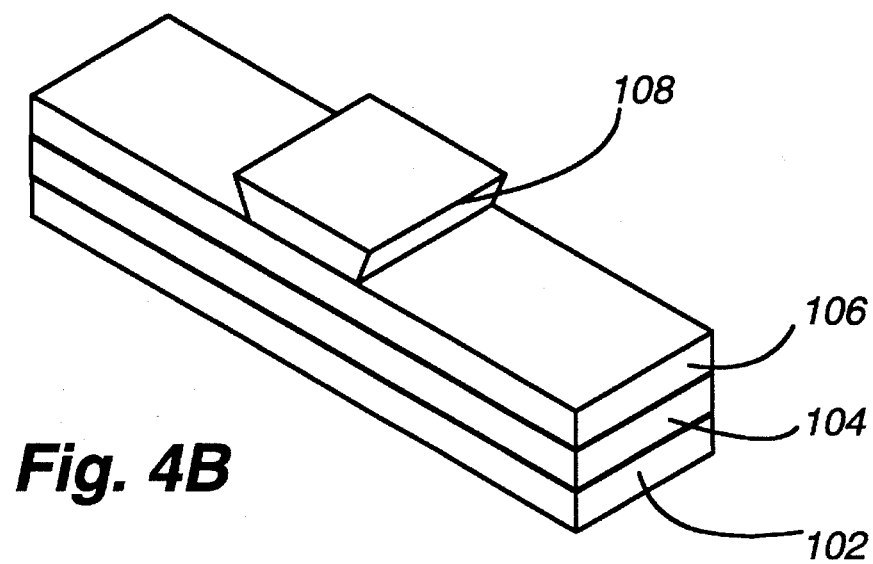

With reference additionally now to FIG. 4B, a region of patterned photoresist 108 is formed on top of the MR layer 106 having sides sloping in a manner substantially as shown in this simplified illustration to facilitate the subsequent processing of the device and to result in the desired MR structure.

Figure 4C:
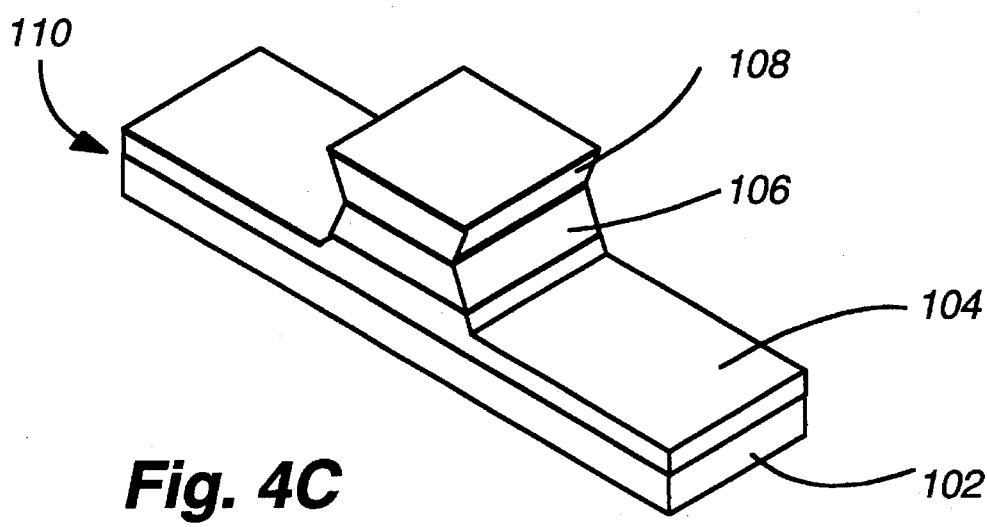

Thereafter, as shown in FIG. 4C, an ion milling operation is undertaken at the exposed upper surface of the MR layer 106 to produce a mesa 110 comprising a shortened MR layer 106 and an MSL layer 104 somewhat reduced in thickness due to the ion milling operation. In practice, the ion milling operation may be carried out as a function of time/power until the desired amount of material removal is effectuated or, alternatively, the process may be controlled by reference to a secondary ion mass spectrometer for providing an indication of when the desired portions of the MR layer 106 have been removed and the upper surface of the MSL layer 104 is then being removed. Using tantalum as an MSL layer 104 has proven to be particularly advantageous with respect to the former time/power process control.

Figure 4D:
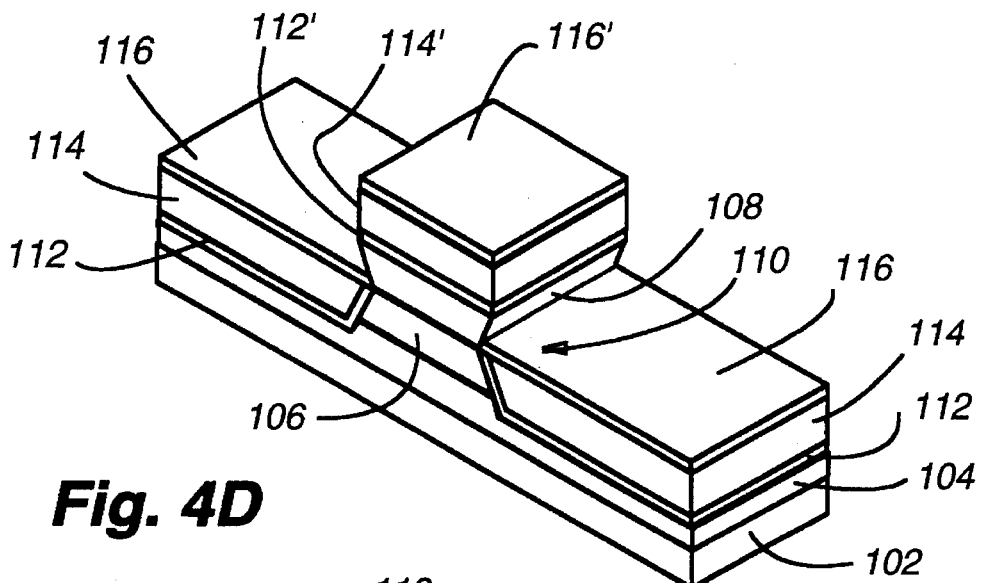
Figure 4E:
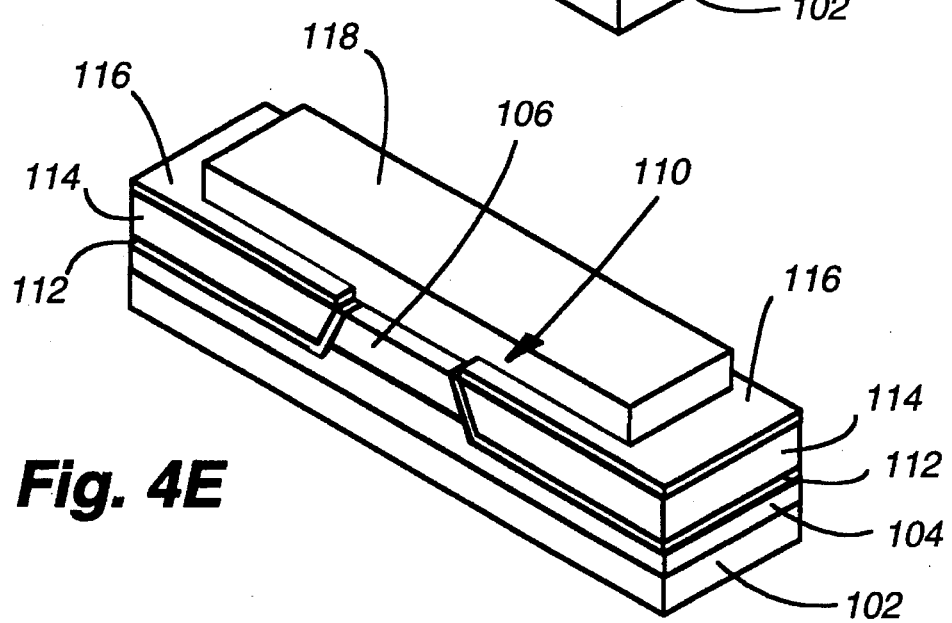
Figure 4F:
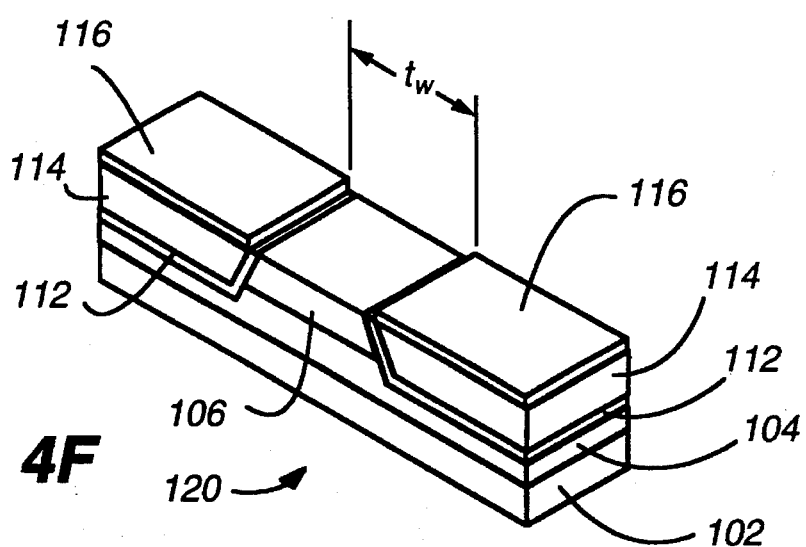

With reference additionally now to FIG. 4D, separation layer portions 112 are then deposited to a thickness of between 20–300 Å overlying the upper surface of the MSL layer 104 and the sides of the mesa 110 adjoining the opposing end portions of the MR layer 106. Likewise, a pair of permanent magnet layer portions 114 are then deposited overlying the separation layer portions 112 such that they are separated from, but substantially coplanar with, the shortened MR layer 106 comprising the mesa 110. Conductors 116 may then be deposited overlying the permanent magnet layer portions 114 to provide electrical contact to the device and define the desired device trackwidth.

With respect to the deposition processes described with respect to FIG. 4D, it can also be seen that a separation layer 112', a permanent magnet portion 114' and a conductor 116' are simultaneously formed on the upper surface of the previously patterned photoresist 108 in addition to the deposition of the same substances in the areas adjoining the mesa 110. The materials and thicknesses for the separation layer portions 112, permanent magnet layer portions 114 and conductors 116 may be as previously described with respect to the preceding Figures.

Following the processing steps illustrated in FIG. 4D, the photoresist 108 is stripped away along with the overlying separation layer 112', permanent magnet portion 114' and conductor 116' and a second photoresist operation is undertaken to provide a second patterned photoresist 118. As can be seen, the second patterned photoresist 118 is utilized in conjunction with another ion milling operation shown in FIG. 4F to form a natural flux closure MR device 120 having the appropriate physical dimensions for the intended application. The natural flux closure MR device 120 shown in FIG. 4F exhibits a trackwidth ("$t_w$") and a stripe height (the width of the active MR region taken orthogonally to the trackwidth dimension) as is appropriate for the particular application in which it will be employed following a conventional lapping and polishing operation along what will become the air bearing surface.

What has been provided, therefore, is a design for a soft adjacent layer biased magnetoresistive device, and a method for producing the same, which incorporates a natural flux closure design utilizing substantially coplanar thin film permanent magnets to stabilize the device. The device disclosed comprises an SAL film and overlying MSL layer in conjunction with an overlying MR film to produce an SAL biased MRS structure with the MR layer then patterned to a shortened length with respect to the SAL and MSL layers. A separation layer, which may comprise a non-magnetic metal or a dielectric material is then deposited over the MSL layer and the sides of the MR layer to a thickness of on the order of 20–300 Å. Permanent magnet layer portions are then deposited over the separation layer followed by the addition of low resistivity metal conductor electrodes, with the spacing between the electrodes defining the sensor active track width.

While there have been described above the principals of the present invention in conjunction with specific structure, materials and processing sequences, it is to be clearly understood that the foregoing description is made only by way of example and not as a limitation to the scope of the invention.

What is claimed is:

1. A process for forming a magnetoresistive device comprising the steps of:

providing a substrate;

firstly forming a soft adjacent layer on said substrate;

secondly forming a magnetic spacer layer on said soft adjacent layer;

thirdly forming a magnetoresistive layer on said magnetic spacer layer;

patterning a photoresist region on said magnetoresistive layer;

removing portions of said magnetoresistive layer surrounding said photoresist region to define a magnetoresistive mesa;

fourthly forming first and second separation layer portions on said magnetic spacer layer and adjoining side portions of said magnetoresistive mesa;

fifthly forming first and second permanent magnet layer portions on said first and second separation layer portions respectively;

sixthly forming first and second conductive layer portions on said first and second permanent magnet layer portions respectively; and removing said photoresist region from said magnetoresistive layer.

2. The process of claim 1 further comprising the steps of:

additionally patterning another photoresist region on said first and second conductive layer portions and an upper surface of said magnetoresistive mesa to define said magnetoresistive device; and removing portions of said first and second conductive layer portions and said upper surface of said magnetoresistive mesa surrounding said another photoresist region to define said magnetoresistive device.

3. The process of claim 1 wherein said step of providing is carried out by means of a substrate having an overlying underlayer.

4. The process of claim 3 wherein said step of providing is carried out by means of a substrate having a first shield layer overlying said underlayer.

5. The process of claim 4 wherein said step of providing is carried out by means of a substrate having a first gap layer overlying said first shield layer.

6. The process of claim 1 wherein said step of firstly forming is carried out by the step of:

depositing a soft adjacent layer selected from a group consisting essentially of NiFeMo, NiFeCr or NiFeTa.

7. The process of claim 1 wherein said step of secondly forming is carried out by the step of:

depositing a magnetic spacer layer selected from a group consisting essentially of Ta or Ti.

8. The process of claim 1 wherein said step of thirdly forming is carried out by the step of:

depositing a magnetoresistive layer substantially comprising NiFe.

9. The process of claim 1 wherein said step of fourthly forming is carried out by the step of:

depositing a non-magnetic separation layer substantially comprising Cr.

10. The process of claim 1 wherein said step of fourthly forming is carried out by the step of:

depositing a dielectric separation layer substantially comprising $Al_2O_3$.

11. The process of claim 1 wherein said step of fifthly forming is carried out by the step of:

depositing a permanent magnet layer selected from a group consisting essentially of CoPt, CoPtTa or CoPtCr.

12. The process of claim 1 wherein said step of sixthly forming is carried out by the step of:

depositing a conductive layer selected from a group consisting essentially of Au.

13. The process of claim 1 wherein said step of removing is carried out by ion milling.

14. A process for forming a magnetoresistive device comprising the steps of:

providing a substrate;

placing a magnetoresistive structure on said substrate, said magnetoresistive structure having an upper magnetoresistive layer, and having underlying layers;

removing a portion of said upper magnetoresistive layer to provide an upper magnetoresistive layer mesa of shortened dimensions with respect to said underlying layers; and longitudinally biasing said upper magnetoresistive layer mesa with substantially coplanar opposing permanent magnet layer portions overlying said underlying layers and spaced apart from said upper magnetoresistive layer mesa.

15. The process of claim 14 wherein said step of providing is carried out by providing a substrate selected from a group consisting essentially of glass, Si or $Al_2O_3$-TiC.

16. The process of claim 14 wherein said step of placing is carried out by placing a soft-adjacent-layer/magnetic-spacer-layer/upper-magnetoresistive-layer structure on said substrate.

17. The process of claim 16 wherein said step of removing is carried out by the steps of:

patterning photoresist on said upper-magnetoresistive-layer to define said magnetoresistive layer mesa thereon; and ion milling said upper-magnetoresistive-layer to remove portions of said upper-magnetoresistive-layer not covered by said photoresist.

18. The process of claim 17 wherein said step of longitudinally biasing is carried out by the steps of:

additionally overlying opposing sides of said magnetoresistive layer mesa with a separation layer; and depositing said permanent magnet layer portions on said separation layer.

19. The process of claim 18 wherein said step of additionally overlying is carried out by means of a material selected from a group consisting essentially of non-magnetic metals or dielectrics.

20. The process of claim 14 further comprising the step of:

forming a pair of conductors to provide electrical contact to said magnetoresistive device.

21. The process of claim 20 wherein said step of forming is carried out by the step of:

contacting said permanent magnet layer portions with said conductors.

22. The process of claim 20 wherein said step of forming is carried out by the step of:

contacting said magnetoresistive layer mesa with said conductors.

* * * * *